(12) United States Patent
Hochstenbach et al.

(10) Patent No.: US 9,466,579 B2
(45) Date of Patent: Oct. 11, 2016

(54) REINFORCED STRUCTURE FOR A STACK OF LAYERS IN A SEMICONDUCTOR COMPONENT

(75) Inventors: Hendrik Pieter Hochstenbach, Nijmegen (NL); Willem Dirk Van Driel, Den Bosch (NL)

(73) Assignee: NXP B.V., Eindhoven (NL)

( * ) Notice: Subject to any disclaimer, the term of this patent is extended or adjusted under 35 U.S.C. 154(b) by 1414 days.

(21) Appl. No.: 12/670,484

(22) PCT Filed: Jul. 17, 2008

(86) PCT No.: PCT/IB2008/052874
§ 371 (c)(1),
(2), (4) Date: Jan. 25, 2010

(87) PCT Pub. No.: WO2009/013678
PCT Pub. Date: Jan. 29, 2009

(65) Prior Publication Data
US 2010/0193945 A1    Aug. 5, 2010

(30) Foreign Application Priority Data

Jul. 26, 2007  (EP) ..................................... 07113258
Jul. 17, 2008  (WO) .................. PCT/IB2008/052874

(51) Int. Cl.
*H01L 23/48*    (2006.01)
*H01L 23/00*    (2006.01)
(Continued)

(52) U.S. Cl.
CPC ............ *H01L 24/05* (2013.01); *H01L 23/3192* (2013.01); *H01L 23/522* (2013.01); *H01L 23/5283* (2013.01); *H01L 23/53295* (2013.01); *H01L 23/562* (2013.01); *H01L 24/16* (2013.01); *H01L 2224/0401* (2013.01); *H01L 2224/05568* (2013.01); *H01L 2224/13006* (2013.01); *H01L 2224/16* (2013.01); *H01L 2924/0002* (2013.01);
(Continued)

(58) Field of Classification Search
USPC ........................... 257/784, E21.582; 438/617
See application file for complete search history.

(56) References Cited

U.S. PATENT DOCUMENTS 4,764,482 A    8/1988  Hsu
5,091,321 A    2/1992  Huie et al.
(Continued)

FOREIGN PATENT DOCUMENTS

EP    0064854 A1    11/1982
EP    0613181 A1     8/1994
(Continued)

OTHER PUBLICATIONS

Xiao, Guowei, et al; "The Effect of Cu Stud Structure and Eutectic Solder Electroplating on Intermetallic Growth and Reliabity of Flip Chip Solder Bump"; Proceedings 50th Electronic Components and Technology Conference; 2000; pp. 54-59.
(Continued)

*Primary Examiner* — John C Ingham

(57) ABSTRACT

The present application relates to a reinforcing structure for reinforcing a stack of layers in a semiconductor component, wherein at least one reinforcing element having at least one integrated anchor-like part, is provided. The basic idea is to reinforce bond pad structures by providing a better mechanical connection between the layers below an advanced under-bump metallization (BUMA, UBM) by providing reinforcing elements under the UBM and/or BUMA layer.

17 Claims, 10 Drawing Sheets

(51) Int. Cl.
  *H01L 23/31* (2006.01)
  *H01L 23/522* (2006.01)
  *H01L 23/528* (2006.01)
  *H01L 23/532* (2006.01)

(52) U.S. Cl.
  CPC ............ *H01L 2924/014* (2013.01); *H01L 2924/01005* (2013.01); *H01L 2924/0105* (2013.01); *H01L 2924/01006* (2013.01); *H01L 2924/01012* (2013.01); *H01L 2924/01013* (2013.01); *H01L 2924/01014* (2013.01); *H01L 2924/01015* (2013.01); *H01L 2924/01019* (2013.01); *H01L 2924/01023* (2013.01); *H01L 2924/01028* (2013.01); *H01L 2924/01029* (2013.01); *H01L 2924/01033* (2013.01); *H01L 2924/01047* (2013.01); *H01L 2924/01067* (2013.01); *H01L 2924/01068* (2013.01); *H01L 2924/01074* (2013.01); *H01L 2924/01075* (2013.01); *H01L 2924/01078* (2013.01); *H01L 2924/01079* (2013.01); *H01L 2924/01082* (2013.01); *H01L 2924/05042* (2013.01); *H01L 2924/14* (2013.01); *H01L 2924/1461* (2013.01); *H01L 2924/181* (2013.01); *H01L 2924/19041* (2013.01); *H01L 2924/19043* (2013.01); *H01L 2924/30105* (2013.01); *H01L 2924/351* (2013.01)

(56) References Cited

U.S. PATENT DOCUMENTS

| | | |
|---|---|---|
| 6,118,180 A | 9/2000 | Loo et al. |
| 6,291,331 B1* | 9/2001 | Wang et al. ............... 438/618 |
| 6,303,420 B1 | 10/2001 | Sridhar et al. |
| 6,495,917 B1 | 12/2002 | Ellis-Monaghan et al. |
| 6,599,823 B1* | 7/2003 | Lin ............................. 438/618 |
| 6,716,709 B1 | 4/2004 | Springer et al. |
| 7,420,278 B2* | 9/2008 | Tomita ........................ 257/758 |
| 2003/0178644 A1 | 9/2003 | Lee et al. |
| 2004/0018660 A1 | 1/2004 | Kim et al. |
| 2004/0082101 A1 | 4/2004 | Honda |
| 2004/0119164 A1 | 6/2004 | Kurashima et al. |
| 2005/0040531 A1* | 2/2005 | Kurokawa .................. 257/756 |
| 2005/0173806 A1 | 8/2005 | Matsubara |
| 2006/0022341 A1* | 2/2006 | Sir ........................ H01L 21/486 257/758 |
| 2006/0103025 A1* | 5/2006 | Furusawa ............ H01L 23/3157 257/758 |
| 2007/0120256 A1* | 5/2007 | Chen .................... H01L 23/5226 257/758 |

FOREIGN PATENT DOCUMENTS

| | | |
|---|---|---|
| EP | 0875934 A2 | 11/1998 |
| EP | 1333494 A2 | 8/2003 |
| GB | 2135525 A | 8/1984 |
| GB | 2459695 A | 11/2009 |
| JP | 2007 180363 A | 7/2007 |
| WO | 2004059708 A2 | 7/2004 |
| WO | 2005/115679 A1 | 12/2005 |

OTHER PUBLICATIONS

Bonda, Rao, et al; "Improved Bonding Pad Design for Fluxless Flip Chip Bonding Process and Low Fracture Strenght Substrates"; Proceedings 50 Electronic Components and Technology Conference; 2000; pp. 1701-1704.

* cited by examiner

REINFORCED STRUCTURE FOR A STACK OF LAYERS IN A SEMICONDUCTOR COMPONENT

FIELD OF THE INVENTION

The present invention generally relates to a reinforcing structure for reinforcing a stack of layers in a semiconductor component. The present invention further relates to a method for manufacturing a reinforcing structure for reinforcing a stack of layers in a semiconductor component.

BACKGROUND OF THE INVENTION

Mainly, so-termed chip scale packages (CSPs) are concerned here. A semiconductor substrate, e.g. comprising an electrical element like a diode, a transistor, a MEMS (Micro-Electro-Mechanical Element) or a capacitor, is fixed to a board, such as a printed circuit board (PCB), by means of solder balls without using an additional carrier. A CSP is used inter alia for so-termed power transistors and for electrostatic discharge (ESD) diodes, usually in combination with a passive filter comprising resistors, capacitors and/or coils. CSPs are furthermore used in particular for frequency modulation (FM) radio. This is a semiconductor with an amplifier and a tuner and any circuits that may further be required, which is capable of performing a radio function in a mobile telephone in its entirety. Partially because of the small amount of space that is available in a mobile telephone, the size of the package is of importance.

Generally, the solder balls of a CSP are mounted directly on a motherboard or PCB provided with electrodes corresponding to the solder balls. The solder balls are soldered onto the board to obtain an electronic device. During said soldering and during use of the device, stresses will occur as a result of the differences in thermal expansion between the material of the board and, for example, the silicon of a semiconductor. Said stresses occur in particular in the solder balls and at the interface of the solder balls and the underlying structure. If no measures are taken, this will lead to an insufficient degree of reliability of the electronic device, in particular during thermal cycling (TMCL) and fall tests. This has led to the provision of stress buffering packages as described in the following paragraphs, in which a stress buffering means for absorbing stresses is provided between the I/O pads and the solder balls.

A known solution is presented in FIG. 1, which shows a package 30 in which a stress absorbing layer 32 of polyimide is provided on top of a passivation layer 34. An opening is present in the layer 32, which opening at least partially coincides, seen in projection, with the opening in the passivation layer 34. An underbump metallization (UBM) 36 is present partially on the stress absorbing layer 32 and partially in the opening (for contact with the I/O pads 40 made of Aluminum). The UBM 36 thus has the shape of an upside-down cowboy hat. The UBM 36 does not fill the openings in the passivation layer 34 and the buffer layer 32 completely, so that a hollow is formed. As a result, the solder balls 38 are partially present in said hollow. In this solution, too, a stress buffering means comprising the stress absorbing layer 32 and the UBM layers 36 is thermomechanically uninterrupted. The fact of the matter is that the UBM layer 36 is a hard layer, certainly in comparison with the material of the stress absorbing layer 32 and the solder balls 38, which hard layer 36 generally comprises nickel and which will transmit the stresses that occur to the adjacent UBM structures 36 via the surrounding polyimide layer 32.

Varying phases of heating and cooling occur during TMCL. This is discussed, for example, in patent documents GB 2,135,525 and EP 0 064 854. It is also known for ball grid array (BGA) packages. It is a generally known fact that the largest problems with TMCL normally occur at the solder balls furthest away from the center of the package (i.e. the center of the semiconductor, also referred to as the neutral point). After all, in TMCL the board expands more than the semiconductor. The left-hand edge of the semiconductor is pulled to the left and the right-hand edge is pulled to the right relative to the center of the semiconductor upon heating, therefore. The difference in movement between the semiconductor and the board is much larger at the edge of the semiconductor than somewhere in the center.

Besides the above, CSPs and other flip chip packages evidently constitute an optimum in terms of miniaturization, since the package size is equal to the chip size.

SUMMARY OF THE INVENTION

The present invention comprises the perception that in the prior art it is not known how to provide a reliable CSP for chips that have been manufactured in advanced technology, particularly with several interconnect layers and dielectric layers of organic materials, the latter being also called low-K materials. In particular it is not known how to make a CSP that passes drop test and provides sufficient stress release during thermal cycling, when the chip is made in advanced technology using a stack of layers with several active and/or interconnecting metal layers and dielectric layers of low-K materials.

In the beginning, FM radio structures were build in a BiMOS process with only 2 metal layers in such a stack of layers. Such stack of layers was strong enough to withstand drop impact and TMCL stresses. Later on it was used a BiMOS process with 3 metal layers. Such stacks began to show weakness in the stack of layers. Now FM radio structures are made in full CMOS processes with even 6 to 8 metal stacks. And 3 to 5 of those metals in that stack are isolated with low-K $SiO_2$, which is even weaker that the standard $SiO_2$. The layout of the layers in such prior art metal stack is a consequence of the active elements that are placed in the silicon. As known such metal stack is always below the passivation layer of the package structure. Such known stack of layers with several active and/or interconnecting metal layers and dielectric layers of low-K materials can be seen in FIG. 2.

According to FIG. 2 a metal stack 100 is between a passivation 102 and the silicon substrate 104. The metal stack 100 of CMOS processes can in fact be divided in upper metal layers 106 that are isolated with normal $SiO_2$ layers 107 and lower metal layers 108 that are isolated by the weak low-K $SiO_2$ layers 109. The present invention now further comprises the perception that there is first a stiff silicon layer 104, then a weak stack 108 due to weak low-K $SiO_2$ layers 109 and then the metal stack 106 with the normal $SiO_2$ layers 107 which is again stiff. On top of the metal stack 100 there is a top metal layer 40 of aluminum acting as an I/O or bondpad layer which is again soft. This is not a reliable structure in terms of mechanical strength.

An object of the present invention is to provide enhanced reliability of a stack of layers in a semiconductor component.

This object is achieved by providing a reinforcing structure for reinforcing a stack of layers in a semiconductor component, characterized by at least one reinforcing element having at least one integrated anchor-like part.

The present invention comprises an elaborated insight in the distribution of stresses and failure mechanisms in the semiconductor component, e.g. in a CSP, as follows:

In order to pass the drop test, it is important that the semiconductor component may absorb stresses. Here, it is further of importance that the UBM 36 is stiff and the top metal layer 40 made of aluminum is again soft to act as a stress absorption. However, with a low-K dielectric material 109 in the stack of layers 100, the interconnect structure 108 is soft and brittle, while the stack 106 with the passivation layer 34 (e.g. silicon nitride) is stiff and hard. This leads to the risk, i.e., failure mechanism, that both the top metal layer 40 of aluminum and the interconnect structure 108 will deform to absorb the stress. Then, the passivation layer 34 needs to deform as well, which is problematic. Hence, there is a risk that cracks are formed in the passivation layer 34. The aforementioned structure also leads to a risk that the metal stack 100 will break and or crack when the UBM layer 36 and the solder bump 38 cannot absorb all stresses and deformations due to TMCL and drop impacts. Thus by making the interconnect structure 108 harder, particularly below the UBM 36, the deformation of the interconnect structure 108 is reduced and the risk of crack formation in the soft metal stack 108 diminishes. The metal stack 100 and in particular the interconnect structure 108 can be made harder for example by using plugs in the structure 100 underlaying the UBM 36. The combination of the demping of the Al layer 40 under the UBM 36 and the reinforcement of the layers 100 under the bump 38 will overcome the risk of cracking of the passivation layer 34 and the underlaying structure 100 with the weak low-K layers 109.

Thus by making the interconnect structure harder, particularly below the UBM 36, its deformation reduces and the risk of crack formation of the passivation layer 34 diminishes.

Stress during thermal cycling occurs due to the relative displacement of chip and board. The semiconductor component has to release these stresses. Now, with organic low-K material, the inventors have understood the risk that the differential expansion is to be released in the interconnect structure of the stack of layers, i.e., the bond pad might have the tendency to expand with the board instead of with the chip. Then, the forces is not oriented vertically (i.e. perpendicularly to the chip surface), but laterally (i.e. parallel to the chip surface). And there is a risk for delamination between the individual layers of the stack of layers. Thus by anchoring layers in each other with the inventive reinforcing elements, a resistance against delamination is built in. Moreover, due to the fact that the UBMs are preferably mechanically decoupled from each other, also the UBM and evidently the solder bump can contribute to the stress release.

In particular, the present invention has now build in reinforcement in the design of metal stacks to make it stronger against drop impact and TMCL stresses to avoid cracking. The present invention overcomes the problems of the prior art by making stack of layers, preferably the low-K stack, stiffer by adding those reinforcing elements, which in the present application are also called additional layer-linking elements, plugs, klinknagels or vias. To further improve the stability it is preferred to connect the low-K layers with each other and to connect the low-K stack of layers with the normal SiO$_2$ stack and the silicon. Then in total the whole stack is stiffer and better resistant against drop impact etc.

Preferably it is provided a chain of reinforcing elements that starts from the bottom layer of the normal SiO$_2$ stack through all the layers until the silicon. Below there are suggested a number of directions through the whole stack to build such chain. However, it is also possible to use those plugs also between the metal layers in the normal SiO$_2$ stack.

According to preferred embodiments of the present invention, the stack of layers in a semiconductor component can comprise:

an aluminum layer underneath an UBM layer which aluminum layer is preferably soft (large elasticity) in comparison to the material of the passivation layer, and wherein neighbouring UBMs preferably are mechanically decoupled from each other; and/or a reinforcing structure according to the present invention, preferably below the UBM, in the interconnect structure of metallisation layers and dielectric layers, such that the layer stack, preferably below the UBM, is harder, preferably in comparison to the UBM, and preferably such that (the) individual layers in the interconnect structure are anchored to each other.

In the following further embodiments are outlined:

The specific construction of an advanced UBM is referred to as BUMA. It particularly comprises a relatively thick layer of Aluminum or an aluminum alloy on top of which NiAu as the classic UBM is provided (the Au being a thin surface layer for adhesion purposes). A specific feature of the BUMA is that the solder also extends to the side faces of the classic UBM. Thus, the effective area between solder bump and the classic UBM is increased, which is good for passing the drop test. Additionally, the shape of the solder bump appears somewhat more flexibility for a slight change in orientation/rotation (i.e. when the bond pads on chip and on board are not completely aligned). Another preferred feature is the extension of the interface between Al and Ni (first and second layer) in a direction towards the chip surface (ideally perpendicularly to the surface, but manufacture is never ideal)

The provision of a plurality of independent reinforcing structures and/or elements instead of one rigid structure.

The shape of individual, mutually independent reinforcing structures, supports, vias, and/or klinknagels.

The focus in the reinforcing structure on the location below the (vertical) interface between BUMA and electroless nickel.

A substantially U-, V-, W-, M-, ΛΛ-, cone-, frustum- and/or triangular-like layout of the independent reinforcing structure.

A maximum density of the reinforcing structures and/or elements to avoid a too high parasitic capacitance which often can negatively affect the operation of the device in high, e.g. FM frequencies.

A reduction of density or even absence of reinforcing structures and/or elements in other areas, because the stresses are recognized to be the largest below the bond pads at the edge of the chip.

As preferred options the provision of active elements, e.g. transistors below the UBM, an increase of the number of maximum of bond pads and/or bumps in a CSP, and/or the use of the same construction in a flipchip BGA package is possible.

Embodiments of the present invention also comprise the perception that none of the aforementioned prior art documents is aware of or discusses the problems when having active elements and/or metal elements, like interconnection traces or dummy metals, under the ball or bump. Stresses on those additional elements are not discussed in the aforementioned prior art.

Those additional elements are preferably also to be placed under the ball because of the fact that this makes it possible to reduce the surface area per semiconductor and thus obtain more products from a single wafer or batch. This reduction of the I/O pad, which is not combined with a reduction of the solder ball, provides a reduction of this unusable part of the semiconductor. This can be seen for example in the prior art of U.S. Pat. No. 6,118,180. This document shows a metal layout on a semiconductor chip to be used in such a flip chip technique. This reference wants to have a flip chip metal layout which is compatible with reduced chip pitches by providing a metal layout on a semiconductor chip which comprises a surface metal bonding pad, a metal region and an UBM under a solder ball. The metal layout is shown in FIG. 3. FIG. 3A shows a cross-sectional view and FIG. 3B shows a corresponding top view. The surface metal I/O pad has reference numeral 402. The FIGS. 3A and 3B show an interconnecting trace 404 and dummy metal elements 430. The UBM has reference numeral 408. On top of the UBM 408, a solder bump 412 is present.

As can particularly be seen in FIG. 3A the interconnecting trace 404 and dummy metal elements 430 are defined adjacent to said bonding pad 402 and spaced between about 1.0 and 3.0 μm from said bonding pad 402. The UBM 408 and even more the ball 412 overly said surface metal pad 402 and also at least portions of said adjacent metal elements 404, 430. But this document is silent about the stresses which are induced in the structure when TMCL or drop tests are applied. There is no stress buffer below the UBM 408 in this document which stress buffer could absorb said stresses which occur in the solder ball and at the interface of the solder ball and the underlying structure during TMCL or during a drop test.

Although this prior art uses dummy metals 430 under the ball to make the surface of the passivation layer more flat, this prior art is not aware of or discusses the problems when having such dummy metals under the ball. The negative impact of stresses caused by the dummy metals 430 and by the interconnecting trace 404 or of any other possible additional elements under the ball are not at all discussed in this prior art. Accordingly no solutions to this problem are discussed or proposed in the prior art.

In another embodiment of the present invention a planarized first layer provides a planarized upper passivation surface and therefore the embodiment also avoids cracks in the passivation layer due to brittleness and possible delamination in the first layer due to stresses caused by a structure of a combination of a metal element, e.g. an interconnecting element, with a dielectric, e.g. organic, element with low K.

This embodiment of the present invention also solves the problems of the prior art with limited board level reliability (BLR) during TMCL and drop tests. This also overcomes the problem that the limited BLR of the prior art also had reduced the maximum array size one can possibly use, seeing that with larger bump arrays the reliability decreases. Without the special precautions of the present invention mainly the solder balls will absorb the difference in thermal expansion between the PCB and the semiconductor of the substrate. In the prior art the limited BLR had limited the possible maximum array size of wafer level packaging (WLP) to an array size of 7×7 with 0.5 mm bump pitch. This limited the application of WLP to analog devices, integrated discretes and FM radio devices. Due to the present invention it is now possible to make WLP available for passive integration devices and for digital signal processing (DSP) devices.

An additional advantage of applying an Al layer is that the UBM which is normally NiAu can be applied with an electroless deposition process, which saves a mask step. The mask step is by far the most expensive step of the packaging process.

Another perception of embodiments of the present invention is that the degree of reliability can be enhanced by splitting up a stress buffering element into smaller individual elements, in particular by providing a separate stress buffering element for each solder ball. Each stress buffering element absorbs at least a significant part of the stresses that are set up in the solder balls and in the underlying structures as a result of the differences in thermal expansion between the electrical element and an associated board, preventing premature fracturing and dysfunctioning of the electronic connections in the package.

Even more improved reliability can preferably be obtained if the stress buffering elements are not connected, which is effected by providing the passivation layer. This means, among other things, that preferably the upper side and the sides, at least part of the sides, of the stress buffering elements do not have an interface with the passivation layer in such an embodiment.

The separate (from a thermomechanical point of view) stress buffering elements provide at least two additional mechanisms for stress relaxation and deformation that the prior art does not provide.

As already noted before, the difference in movement between the semiconductor and a board is larger at the edge of the semiconductor than somewhere in the center. The amount of stress in one solder ball is greater than in another solder ball, therefore. When the stress buffering means is not split up and is thermomechanically uninterrupted, it is conceivable that stresses generated by one solder ball are transmitted to an adjacent solder ball, in which case the stresses may accumulate at an unpredictable location, such that cracks are locally formed. This may take place at the interface between a solder ball and an associated connecting structure, for example. The stresses that occur in adjacent solder balls may be transmitted to a solder ball positioned therebetween, for example, in such a way that said stresses will intensify each other. Solutions with split stress buffers according to embodiments of the present invention prevent the occurrence of such a concentration of stresses.

The combination of a stress buffering element and a solder ball may be regarded as two series-connected springs. Said springs are capable of adjusting themselves optimally in dependence on the specific thermal cycling situation, thus providing a second advantageous mechanism. Said adjustment may differ with every connection from substrate to semiconductor, i.e. for every combination of a solder ball and a stress buffering element.

The fact that the stress buffering elements are preferably thermomechanically independent of adjacent stress buffering elements in itself renders the solution according to such embodiments of the present invention different from the prior art.

A further aspect is the fact that the structure according to the embodiment of the present invention with independent buffer elements does not appear to be suitable for use in combination with redistribution in the stress buffering means. Such a redistribution track would provide more connection to the passivation layer and, combined with a connection to the substrate, would thus lead to failure of the connection between the redistribution track and a bump pad accommodating a solder ball.

The invention further relates to an assembly comprising a substrate and a stress buffering package, to an audio circuit comprising a stress buffering package, to an electronic device comprising an audio circuit and to a method for manufacturing a stress buffering package for a semiconductor component.

As already indicated, in some embodiments of the present invention it is advantageous if an individual and thermomechanically separate stress buffering element be provided for each I/O pad. It is not excluded, however, to use one stress buffering element for a group comprising several solder balls arranged adjacently to each other, or to interconnect the stress buffering elements for a number of solder balls by means of a further connection layer. This obtains in particular for the solder balls located near the center line of the semiconductor. This connection and fixation of a number of thermomechanically fairly uncomplicated solder balls moreover appears to make it possible to carry out a redistribution anyway.

Preferably, stress buffering elements of an electrically conductive material are used, in which in fact the function of electrically connecting the solder balls to the I/O pads is combined with the function of absorbing the stresses that occur. Since the stress buffering elements are individual, patterned elements, this does not present any short-circuiting problems.

The stress buffering means and the solder ball are preferably selected so that they have a comparable elasticity, plasticity and thermal expansion coefficient. For the Young's modulus it is advantageous if both have a modulus of 10-100 GPa, more advantageously 20-80 GPa and even more advantageously 25-75 GPa. A similar effect obtains for the plasticity value: an advantageous value for both is a plasticity limit of 20-250 MPa, it is even more advantageous if this range of values is less wide. Good results have been achieved with a combination of stress buffering elements of an aluminium alloy (E-modulus 60 GPA, plasticity limit 200 MPa) and so-termed SAC solder (tin-silver-copper solder having an E-modulus of 32 GPa and a plasticity limit of 20 MPa), which both have a thermal expansion coefficient of 20-25 ppm/K.

The stress buffering elements are preferably coated with a bonding material for solder, such as nickel. Preferably, the nickel has a sufficient thickness, especially in combination with the use of a high-tin solder, such as SAC. The fact is that this solder tends to slowly dissolve the Ni. Once the Ni layer has been completely consumed, the solder ball will no longer bond and the life of the connection has come to an end. Advantageous results have been achieved with Ni-layers having a thickness of at least 0.4 μm, more preferably 0.8 μm and even more preferably even thicker. It is noted in this connection that both the stiffness and the elasticity limit of Nickel is much higher than that of aluminium (alloys) and solder. Nickel, for example, has an E-modulus of 161 GPa.

Said Ni-layers are usually doped with a retarding agent, which prevents Nickel from dissolving. It is possible to use 8% Vanadium in the Ni for this purpose. Preferably, 5-10% phosphorous is added in the case of NiAu electrodes. The required thickness of the layer of bonding material depends on the diameter of the solder ball and the specific type of folder, of course, and also on the conditions to which an electronic device is exposed during use.

It is very advantageous to apply the bonding layer in such a manner that it is present not only on the upper side but also on the sides of each stress buffering element, at least on that part of the side that does not have an interface with the underlying passivation layer. The visible result is that the solder can also extend on said side. Probably this leads to a different angle of contact between the solder and the underlying surface than in the case in which the bonding layer is only present on the upper side of a stress buffering element. Such a different, probably more advantageous angle of contact may have a positive effect on the deformation of the solder ball in a lateral direction, i.e. parallel to the substrate.

It will be understood, however, that coating the entire stress buffering element with bonding material also leads to an increased resistance of the element against corrosion. Corrosion problems frequently occur in particular with Al. The seal obtained with the bonding material (and also with the solder, therefore) provides an excellent resistance against moisture and all kinds of other environmental factors to which a surface is exposed during further assembly, for example during the cleaning steps, and during use.

An advantageous manner of applying the bonding material, e.g. the UBM, both to the upper side and to the sides of the stress buffer element is by means of an electroless plating technique, as known per se to those skilled in the art. On the other hand, when a sputtering technique is used for applying the Ni, the Ni is only applied to the upper side of the stress buffering elements.

It has become apparent that when aluminium stress buffering elements are used, a minimum and a maximum thickness are to be maintained. When the Al-layer is too thick, the buffering layer will be too soft and will tear. When the Al-layer is too thin, the layer will be too stiff and will likewise tear. A suitable range is a thickness of 1-5 μm. For the sake of clarity it is mentioned that the term "thickness" as used herein is understood to refer to the thickness of the parts of the stress buffering elements that extend from the upper side of the passivation layer. It will be apparent to those skilled in the art that said minimum and maximum values depend on the material that is used. Alloys of Al, such as Al—Mg, are generally stiffer, for example, and require much greater thicknesses. It is not excluded that the stress buffering elements comprise several sublayers, possibly of different materials.

In view of the relation between the required expansion or deformation and the distance to the center line of the semiconductor, and consequently also between the stress load and the distance to the center line of the semiconductor, the enhanced reliability can be enhanced even further by having the stiffness of a stress buffering element decrease as the distance to the center line of the semiconductor decreases. This so-termed on-chip variation can only be used within bounds, of course. Such a variant may provide a solution for chip size packages having a larger matrix than that of 7*7 and/or larger semiconductor surfaces.

As already indicated before, redistribution is not always possible when using electrically conductive and thermomechanically separate stress buffering elements. Apart from the embodiment that has been explained in the foregoing, there is another possibility which is in fact even simpler: it is possible to use a stress buffering element for redistribution if said stress buffering element is not mechanically connected to the opposite substrate or board. This means that the ends of such a redistribution part must be led back to the metallization under the passivation layer via openings therein.

In addition to its use for redistribution (interconnection), this possibility is also very suitable for definition of, for example, coils in such a stress buffering element. The thickness of the Al renders this layer very suitable for this purpose.

For the sake of completeness it is furthermore noted that the use of an UBM of nickel results in a mechanically hard plate between the solder ball and the stress buffering element. It is assumed that the solution according to such embodiments of the present invention will also function on the basis of a series-connected spring system (in which case the spring near the semiconductor is capable of deformation, therefore) without such a hard plate.

In particular it is noted that from WO2005/115679 a solder material is known which is capable of bonding to Al without a separate bonding layer being used. This material can be used to advantage in combination with the present invention, of course. Its use may also be advantageous if a bonding layer is used anyway, viz. to provide additional protection.

An important advantage of the stress buffering package according to the invention is that the I/O pads under the passivation layer can have a small diameter without the diameter of the solder balls being reduced proportionally. This will be explained in more detail in the description of the figures. Compared to the prior art, a reduction from 120*120 µm to 10*10 µm for every I/O pad seems possible. This is a reduction by a factor of more than ten, therefore.

This reduction moreover makes it possible to reduce the surface area per semiconductor and thus obtain more products from a single wafer or batch. Furthermore, the reduction makes it possible to define an active element and/or metal element, like an interconnection or a dummy metal, under the solder balls in a CSP. The large I/O pads as used in the prior art, which were necessary in particular because of the weak bond of the polyimide, led to mechanical stresses that could not be combined with an active element and/or a metal element present thereunder. The reduction of the I/O pad, which is not combined with a reduction of the solder ball, provides a advantageous reduction of this unusable part of the semiconductor. Consequently this solution is very suitable and predestined for use in mobile telephony and other portable products.

It is noted that also the diameter of the I/O pad according to the invention will be smaller than that of the I/O pads shown e.g. in US2004/0082101. To obtain a suitable low resistance of the connection between board and semiconductor by means of the conductive layer, the diameter in the opening through the passivation layer will have to be reasonably large. The fact is that the conductive powder will probably be provided in a flexible, non-conductive material so as to obtain the desired flexibility, which increases the overall electrical resistance of the layer. The overall electrical resistance will thus be lower than, for example, the electrical resistance of a stress buffering element according to the invention, which comprises aluminium.

On of the ideas of the present invention is to provide a simpler package construction usable with standard wafer fabrication materials and technologies, in which construction the stress buffer is preferably an aluminum layer on top of a planarised wafer surface by using a first passivation layer serving as a planarization layer. The first passivation layer is preferably made of $SiO_2$ which is preferably planarized by spin-on-glass (SOG) and subsequent chemical mechanical polishing (CMP). This type of planarisation has the advantage of placing the bumps on active area that saves silicon. The UBM on top of the stress buffer is preferably an electroless NiAu layer. The solder ball is placed simply on top of the UBM.

The terms "roughness" or "interface roughness" mean in the context of the present application the number of steps in an interface and/or the average steepness or slope of steps in an interface. I.e., the higher the number of steps or the higher the average steepness or slope of steps the higher the roughness of such an interface. Steps in this respect are in particular steps created by metal elements or interconnecting traces on the semiconductor substrate. Steepness or slope of a step means in particular the steepness or slope of the edge or riser of the step. The basic idea of embodiments of the present invention is to reinforce the bond pad structure by providing a better mechanical connection between the layers below a BUMA-layer by providing reinforcing elements under the UBM and/or under the BUMA-layer.

BRIEF DESCRIPTION OF THE DRAWINGS

The invention will be explained in more detail hereinafter with reference to the appended figures, in which.

DETAILED DESCRIPTION OF THE INVENTION

Figure 1:
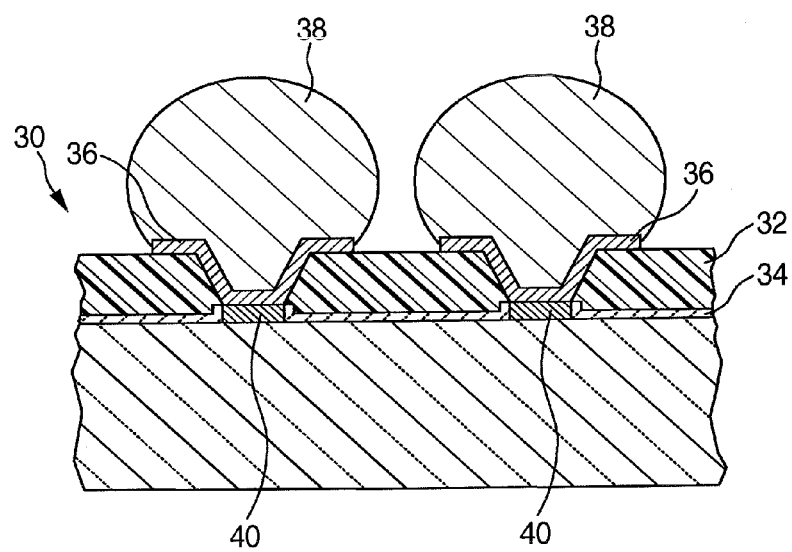
FIGS. 1, 2, 3A and 3B are drawings of known devices of the aforementioned prior art.
Figure 2:
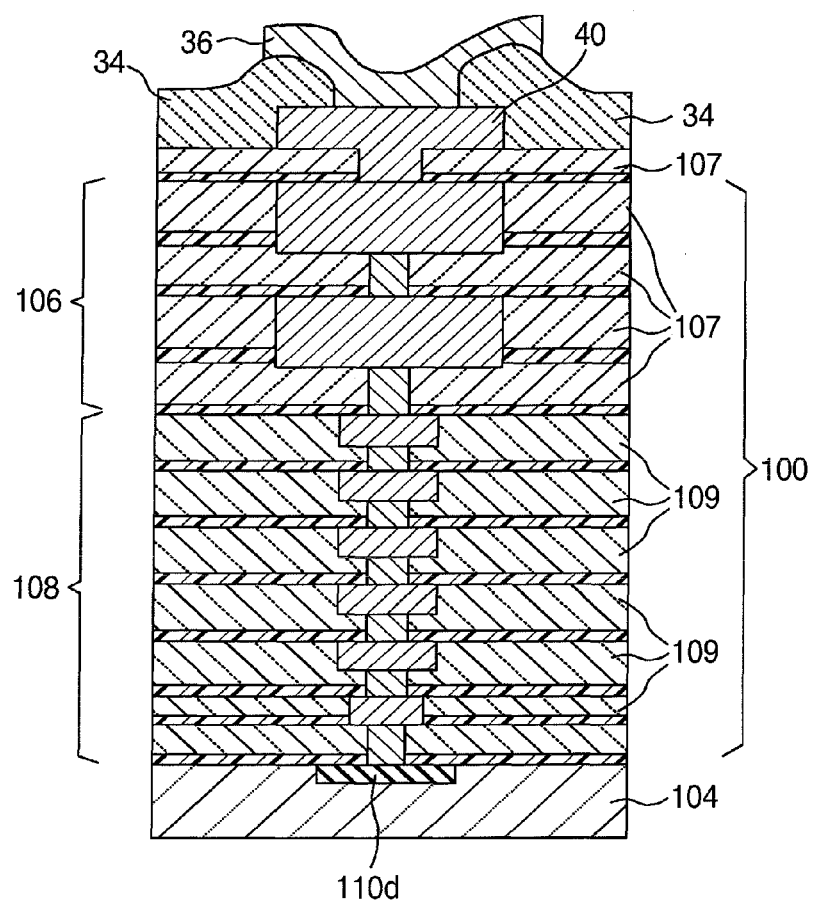
Figure 3A:
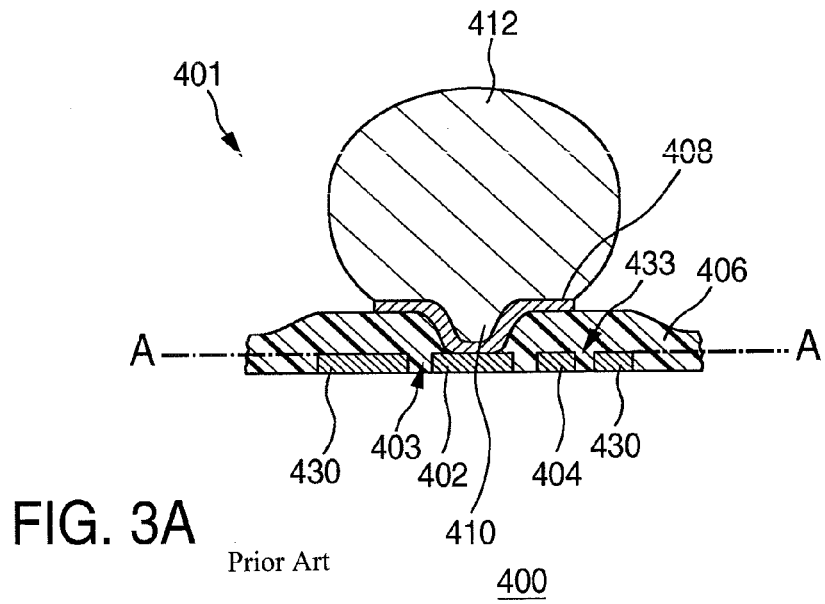
Figure 3B:
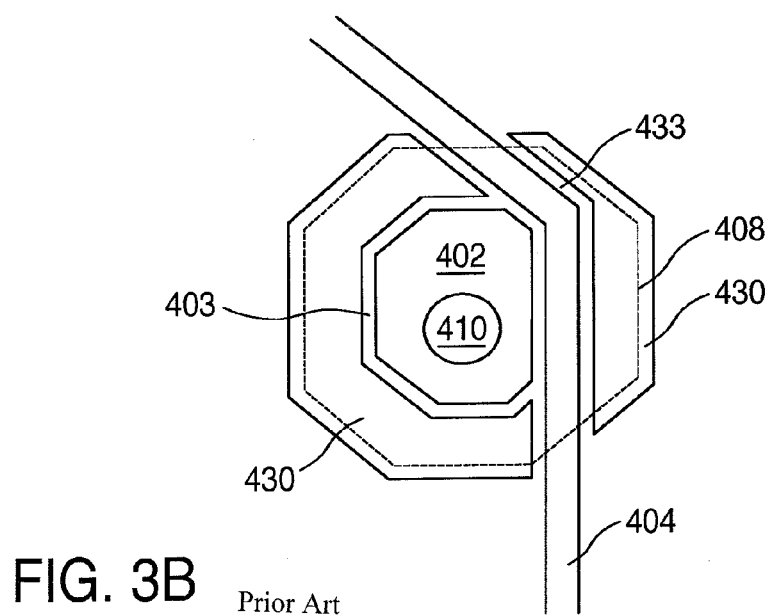

The components in the drawings are not necessarily to scale, emphasize instead being placed upon clearly illustrating the principles of the present invention. Features that are substantially or functionally equal or similar will be referred to with the same reference sign(s).

FIGS. 1, 2, 3A and 3B are drawings of devices of the prior art, which has been discussed in the foregoing.

Figure 4:
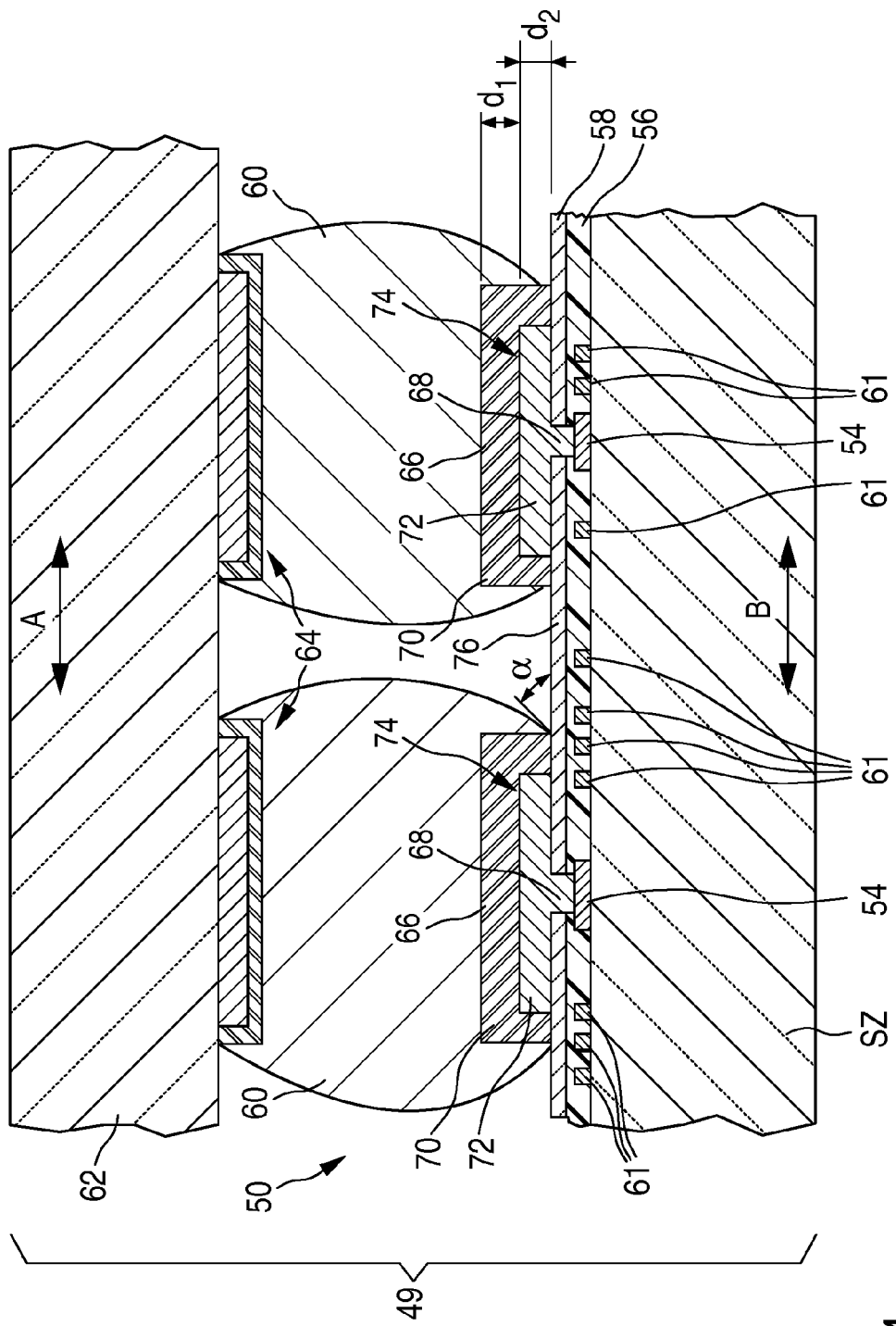
FIG. 4 is a schematic view of a part of a section of a package for a semiconductor according to a preferred embodiment.

FIG. 4 shows a stress-buffering package 49 for a structure 50 on a semiconductor substrate 52, which structure 50 comprises a number of I/O pads 54 on an upper surface of the semiconductor substrate 52. The structure 50 furthermore comprises a first passivation layer 56, which protects the active regions of the structure 50 and exposes the I/O pads 54. The first passivation layer 56 preferably comprises $SiO_2$. Usually an additional second passivation layer 58 of silicon nitride is applied on top of the first passivation layer 56. The second passivation layer 58 should preferably be thicker than 400 nm to avoid pinholes.

Figure 5:
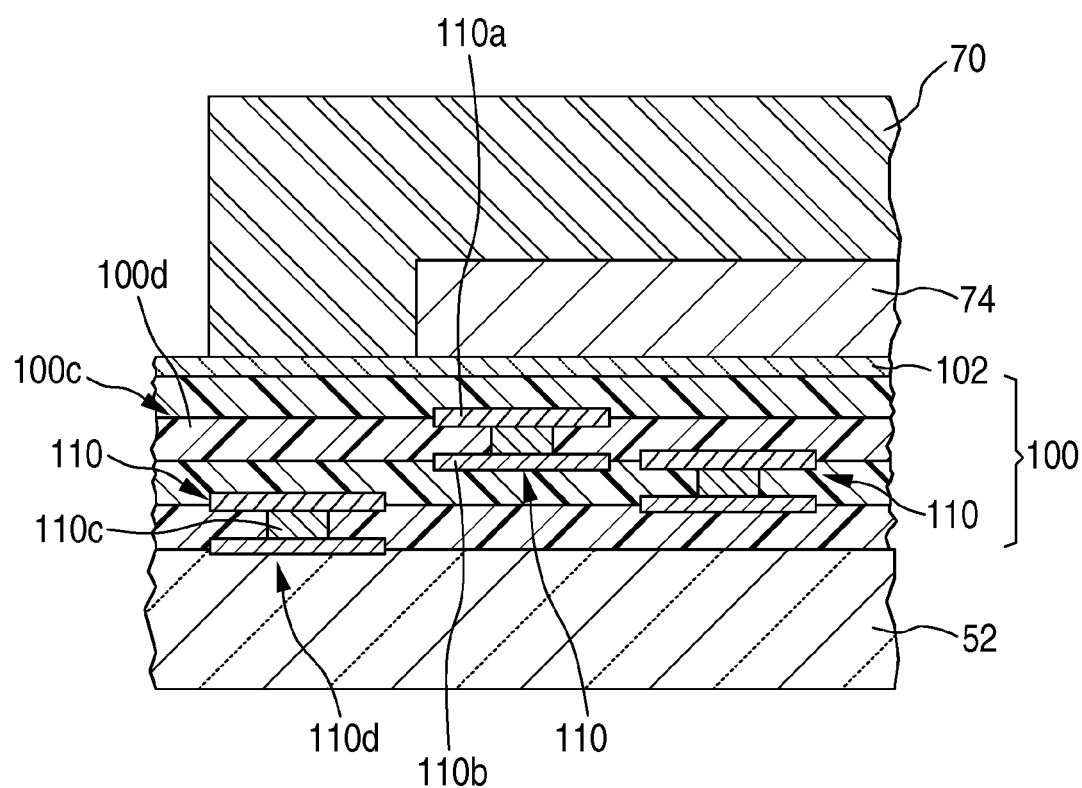
FIGS. 5 and 6A-6D are a schematic drawings of embodiments of the present invention.

The first passivation layer 56 protects metal elements 61 which serve as underlying connecting structures 61. The structures or layers 61 have an irregular top side as shown in FIGS. 5 and 6. This irregular top side is normal practice in integrated circuits (ICs) with many interconnect layers 61. Particularly for a wirebonded chip—which is overmoulded with a moulding compound, e.g. glass-epoxy material,—the irregular top side is advantageous: it leads to a better adhesion between moulding compound and chip. It is thus part of the present invention that such irregular top side is not advantageous for CSPs. The interconnect structure 61 in such advanced ICs is normally made with copper and a process known as dual damascene.

Solder balls 60 function to electrically connect the structure 50 or another electrical element to a board 62, which is to that end provided with electrodes 64. The I/O pads 54 and the solder balls 60 are electrically connected by an UBM 70 and a stress buffering element 74. An outer upper and side-facing surface of the UBM 70 forms a so-termed bond pad 66, which makes it possible to place the solder ball 60 on the UBM 70.

Each stress buffering element 74 is built up of a first part 68, which is provided in an opening in the passivation layers 56 and 58, and a second part 72, which extends from the surface 76 of the second passivation layer 58. The first part 68 makes contact with the I/O pad 54 in question, whilst the second part 72 is electrically connected to the solder ball 60 in question via the UBM 70. The dimensions of the first part 68 in directions parallel to the surface 76 are much smaller than the dimensions in the corresponding directions of the second part 72. This is clearly shown in FIG. 4. A major advantage of this aspect is that it is possible to use relatively small I/O pads 54, at least without there being a need to adapt the diameter of the solder ball 60. This phenomenon is also referred to as repassivation. It is advantageous in particular because the region under the I/O pads 54 cannot normally be used for active circuits or interconnect structures because of the stresses to which the I/O pad 54 are exposed. When the dimensions of the I/O are reduced, as it is the case in the embodiment of FIG. 4, a larger part of the semiconductor substrate 52 an be effectively utilised.

Preferably, each stress buffering element 74 is built up of only one material or one component. It is conceivable, however, for the two parts 68 and 72 to consist of several layers, each layer being geared to the specific properties that are required.

The solder balls 60 form a conductive connection to electrodes 64 of a PCB 62 so as to form an electronic device therewith.

It is a well-known fact that the coefficient of thermal expansion of the silicon of the semiconductor 52 is much lower than the coefficient of thermal expansion of the materials that are used for the PCB. This leads to stresses in the package 49 during testing and during further use. In view of the dimensions of the two components, it is especially differences in expansion in the devices A and B shown in FIG. 4 that are relevant in this connection. Furthermore it will be apparent that the difference in expansion will be larger in the solder balls 60 provided at the edge of the semiconductor substrate 52 than in the solder balls 60 that are located in the center of the semiconductor substrate 52. The problem of thermal stresses plays a much smaller part in the case of the latter solder balls 60, therefore.

According to the shown embodiment of the present invention, the aforesaid stresses are neutralized by the stress buffering element 74. The larger portion of the stresses will be absorbed by the parts 72 of the stress buffer 74. This means that the stresses in one connecting structure/solder ball 60 will not be transmitted to adjacent connecting structures/solder balls 60.

As already noted before, the configuration that is shown in FIG. 4 could be modelled as a set of series-connected springs, with the differences in thermal expansion determining the stretch of the springs and the material and the thickness of a layer determining the spring characteristic. In FIG. 4, for example, a relatively stiff spring corresponding to the UBM 70 is in that case connected to two relatively soft springs, which correspond to the stress buffering part 74 of aluminium and the solder balls 60, respectively. Each figure shows only two such spring assemblies, therefore, but it will be apparent that in practice (where a multitude of solder balls are used) a multitude of spring assemblies will be provided side by side in two directions. In the shown embodiment of the present invention the stretch and the tensions of the springs in one spring assembly do not influence the stretch and the tensions in the other spring system.

With regard to known solutions, it is noted that in view of the fact that the UBM 36 is fixed to the bond pad 40 and to the passivation layer 34 only partially determines the deformation and the relative movement of the UBM 36 with respect to the semiconductor by the relative deformation of the stress buffering layer 32. After all, the UBM 36 is fixed to the semiconductor via the I/O pads, and as a result the relative movement and/or the deformation of the hat shape of the UBM 36 is reduced.

The UBM 70 is preferably E-less nickel and has a thickness $d_1$ in the range of 0.15-5 μm. The nickel is preferably applied by means of an electroless plating process. As a result, also the sides of the part 72 of the stress buffer 74 are coated. This is advantageous both with regard to the protection against corrosion of the stress buffer 74 and with regard to obtaining an advantageous angle of contact a of the solder balls 60.

Each stress buffering element 74 preferably consists of an aluminium alloy. Experiments have shown that good results can be obtained by using an aluminium alloy comprising 0.5% copper and a thickness $d_2$ of the part 72 of the stress buffer 74 of 2.5 μm. Preferably, said thickness $d_2$ ranges between 1 and 5 μm.

Preferably, a separate stress buffering element 74 is used for each solder ball 60, in which case stresses in one solder ball 60 or in the underlying connecting structures 61 are not transmitted to adjacent solder balls 60 and stress buffering elements 74. As already indicated, it is conceivable, however, to use stress buffering elements 74 that are thermomechanically interconnected for a group of adjacent solder balls 60, for example by connecting a number of adjacent stress buffering elements 74 via a connection layer provided therebetween (not shown in FIG. 4). In view of the locally lower thermal stresses, this system could be used in particular for the solder balls 60 that are present near the center line of the semiconductor substrate 52.

Another preference is the fact that the stress buffering elements 74 function best on a second passivation layer 58 having a smooth or flattened or planarized surface. If this is not the case, dangerous stress concentrations may build up in the interface between the part 72 of a stress buffering element 74 and the second passivation layer 58 and also between the underlying connecting structures 61 and the first passivation layer 56, each of which may lead to cracks. Since the second passivation layer follows any indentation or roughness of the first passivation layer 56 it is preferred that the first passivation layer 56 is deposited or treated to have a smooth or flattened or planarized surface facing the second passivation layer 58. To provide such an upper surface for the first passivation layer 56 it is preferred to use at least one of the following processes when depositing the first passivation layer 56 using as the main material $SiO_2$: deposition of tetraethylorthosilicate, deposition by HDP, deposition by SOG. It is also possible to limit parasitic capacitance by using a deposition of a material having a lower dielectric constant than $SiO_2$. To further lower the roughness of the surface of the first passivation layer 56 CMP techniques are used to treat the first passivation layer 56 in order to obtain a smooth upper surface of the first passivation layer 56. The result is that a roughness of an interface between the stress buffering element 74 and the second passivation layer 58 is lower than a roughness of an interface between the metal element 61 and the first passivation layer 56.

FIGS. 5 and 6A-6D are a schematic drawings of embodiments of the present invention.

Figure 6A:
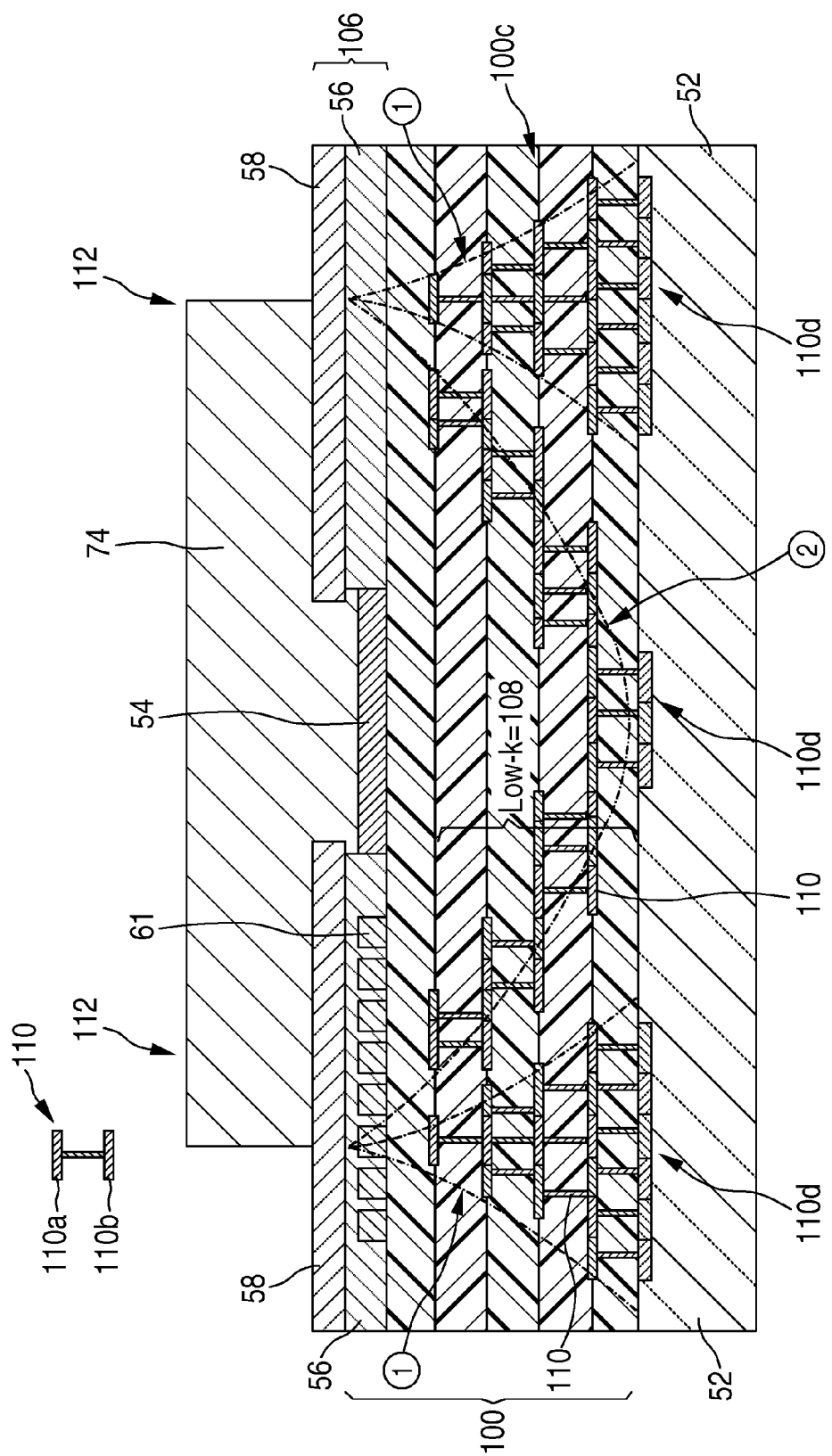

FIG. 5 shows that the metal stack 100 is made stronger by using plugs 110 or "klink nagels" under the BUMA 74 to have a better mechanical connection between the different layers. These plugs 110 only have a mechanical purpose and no electrical; they are dummy plugs 110. To make the metal stack 100 resistant for mechanical loading during drop tests the location to support the low-k metal stack is mainly under the edge of the BUMA as indicated in the detail shown by the drawing of FIG. 5. As can be seen in FIG. 5 the plugs 110 used as a reinforcing structure for reinforcing the stack of layers 100 in the semiconductor component shown in FIG. 5 have to anchor-like parts 110a and 110b. Accordingly, the reinforcing elements 110 have a substantially I-like shape. The anchor-like parts 110a and 110b are positioned at interfaces 100c of layers 100d of the layer stack 100. According to the embodiment of FIG. 5 the anchor-like parts 110a and 110b are fully integrated with a vertical element 110c of reinforcing elements 110. However, the reinforcing elements can also have a T-like shape (not shown). The reinforcing elements 110 can comprise metal semiconductor and/or dielectric material. In the shown embodiment the reinforcing elements 110 are substantially made of metal. The lowest reinforcing element 110 can comprise a lower anchor-like integrated part 110d made of poly silicone. These plugs 110 or "klink nagels" can be made as followed: full metal plates with holes including a maximum amount of via structures in the dielectric layer below. This maximum should comply with the metal density rules as specified in the design rules for the given CMOS-technologies. E.g. in CMOS 065 this is 75%. An example is shown in FIG. 6A. In this figure there are shown two reinforcing structures 1 and 2. Reinforcing structure 1 comprises a number of plugs 110 which are connected with each other to form a substantially Λ-like layout. The tip of the Λ-points to an edge 112 of BUMA layer 75. The length of the verticals parts of the reinforcing elements 110 is the same for all reinforcing elements 110 in the Λ-like layout 1 of FIG. 6A. Additionally, the length of the upper and the lower anchor-like parts 110a and 110b, respectively, is the same for all plugs 110. The same structure in the layout of a Λ is positioned near the other similar edge 112 of BUMA layer 74. Regions 1 of the embodiment of FIG. 6A serve to reinforce the whole semiconductor component against drop impact. This is because the invention has comprises the perception that drop impact will predominantly create forces along the layout of reinforcing structure 1 of FIG. 6A.

Moreover, the embodiment of FIG. 6A comprises another reinforcing structure 2 also comprising plugs 110 having all the same anchor-like parts and vertical parts with always the same length. Again, all plugs 110 of structure 2 are interconnected with each other to create a maximum of reinforcing stiffness against forces acting along the line of the layout 2 of FIG. 6A. Layout 2 is in particular suited to withstand forces created by TMCL loading.

Figure 6B:
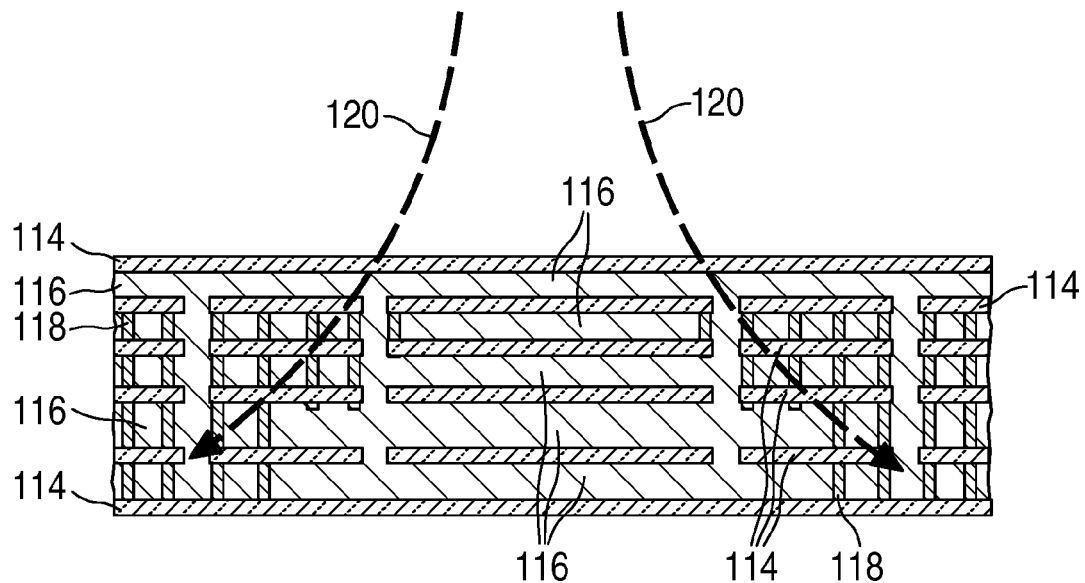

FIG. 6B shows a skimating illustration of another embodiment of the present invention. In the embodiment of FIG. 6B, dielectric layers 114 are sandwiched with metal layers 116. The reinforcing structure of the embodiment of FIG. 6B comprises vertical reinforcing elements or wires 118. Those wires 118 have different length and are intersecting both the dielectric layers 114 and the metal layers 116. This construction reinforces the sandwich of layers 114 and 116. Moreover, there is a further increased reinforcement of the whole structure by increasing the amount of via structures 118 in the out-of-plane direction. This will allow an optimal force guiding along errors 120 to the edge of the bondpad.

Figure 6C:
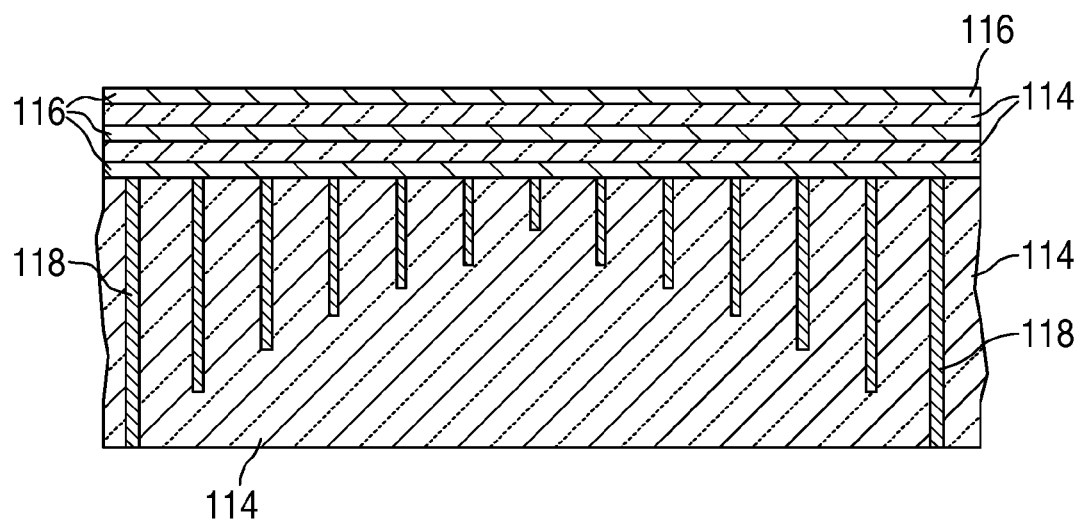

According to FIG. 6C, another idea is to use deep via structures 118 used in the dielectric layers 114, to give optimal resistance to thermal loading. This resistance to thermal loading is directly related to Δ(CTE). The CTE difference between the oxide and the copper via structures 118 is very large (3 ppm/° C. vs. 17 ppm/° C.) but minimal between dielectrics 114 with low mechanical stiffness and strength (i.e. low-k, SiOC) and the copper vias 118 (20 ppm/° C. vs. 17 ppm/° C.). For optimal pull strength, via structures 118 that go deep into the low-k materials 114 will be very beneficial. FIG. 6C gives an example of a bondpad structure in the vertical direction to show an example of how these deep via structures 118 can be constructed in order to distribute bond pad loading to the lower layers. According to the embodiment shown in FIG. 6C the wires 118 serving as reinforcing elements do not have anchor-like parts but are connected to the lowest metal layer 116 of a sandwich of metal layers 116 and dielectric layers 114. Below the lowest metal layer 116 the wires 118 are introduced in the low-k dielectric layers 114. It can be seen that the amount of wires structures 118 is not increased in a plane direction but the vertical length of the wire structures in the out-of-plane direction is increased from a minimal vertical length to a maximum vertical length in a linear manner.

Figure 6D:
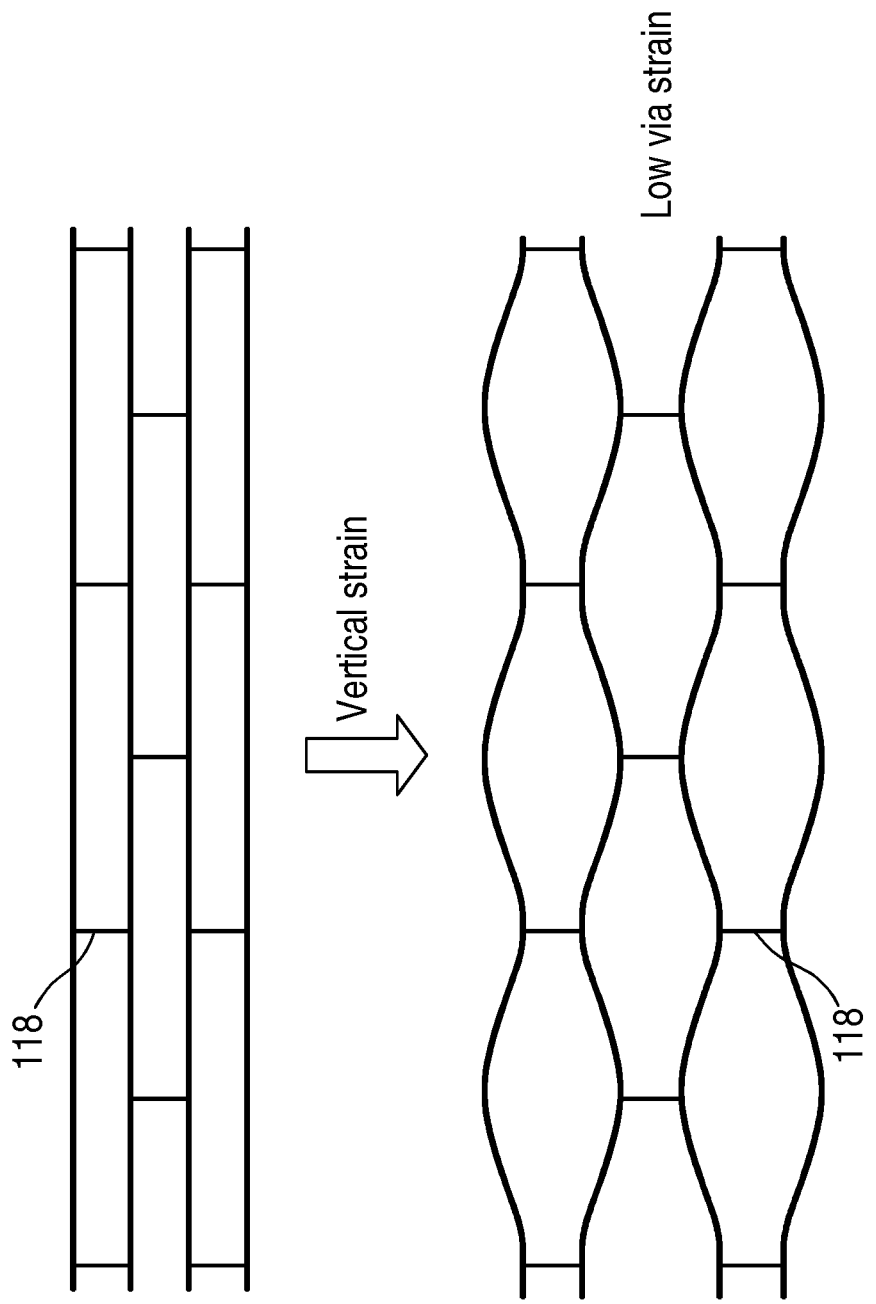

To reduce the vertical stresses in the vias 118 due to thermal strains, the vias 118 can be applied in a staggered way; i.e. not in line. This way the construction can undergo the thermal strains with lower stresses in the bond pad, as shown in FIG. 6D. The conductive material—via (metal) structure becomes less stiff in the vertical direction when vias 118 are placed in a staggered way. This will result in a stress distribution in the dielectric—via layer with lower stresses in the vias and higher stresses in the dielectric material when the wire attached to the bond pad is pulled. The staggered via structure is significantly beneficial compared to the (current/traditional) in line via placement.

Figure 7:
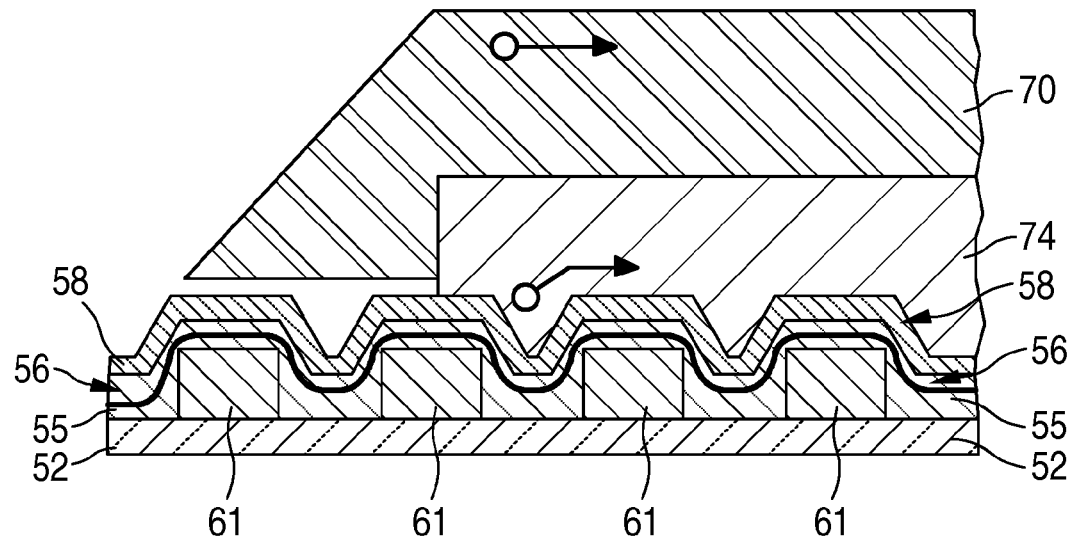
FIG. 7-9 are schematic drawings and pictures showing an interface between the stress buffer layer and the second passivation layer with planarization of the first passivation layer of other preferred embodiments of packages according to the present invention.
Figure 8:
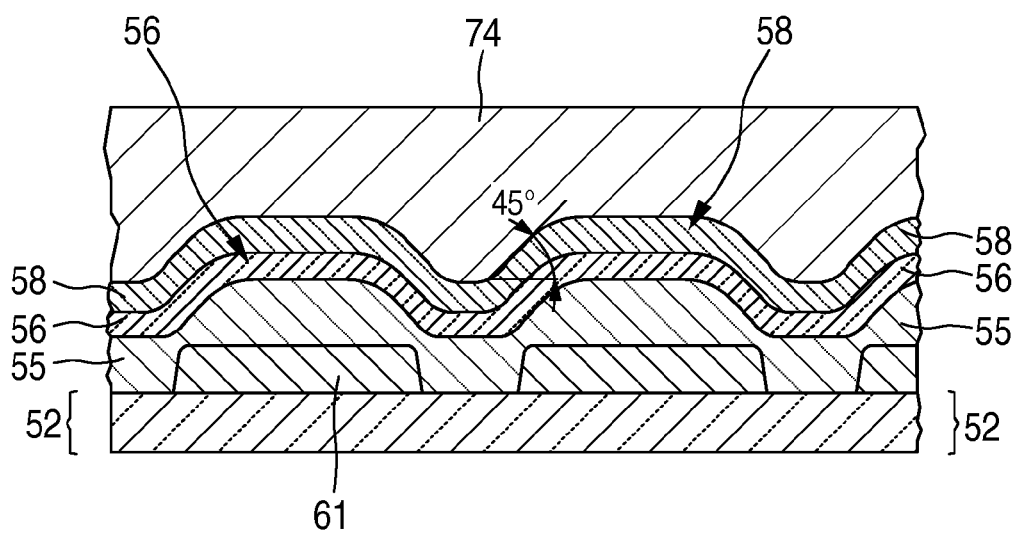
Figure 9:
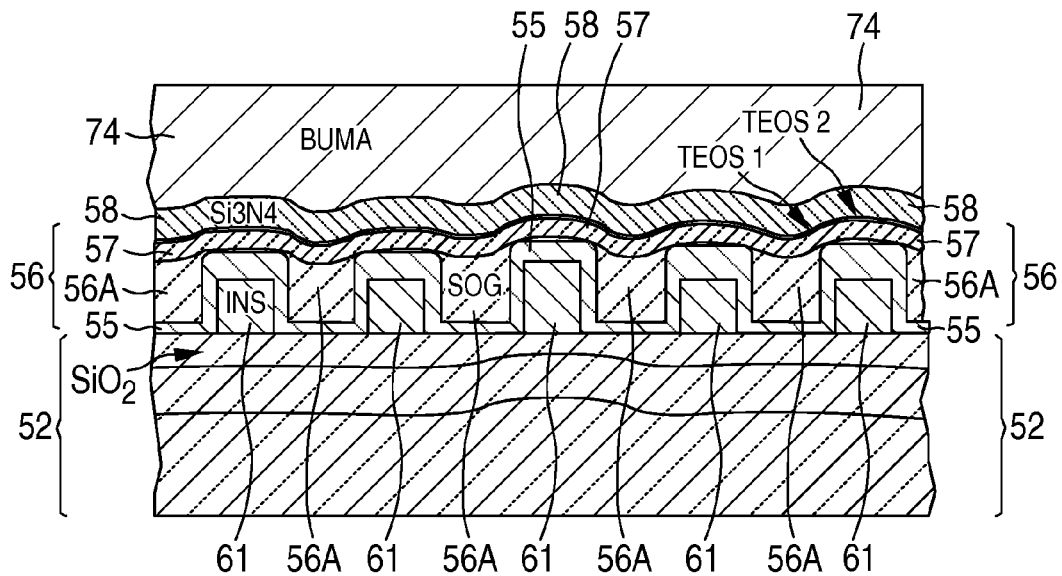
Figure 10:
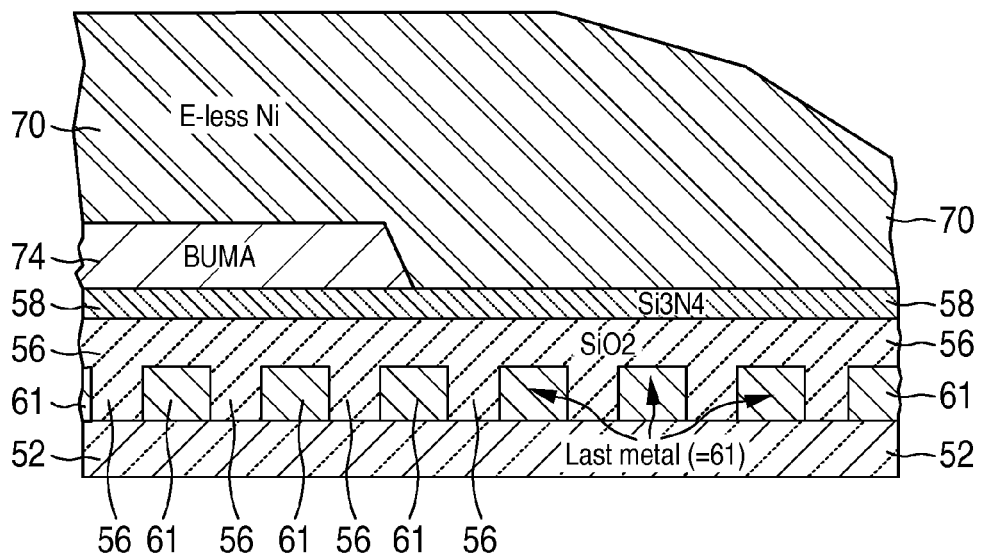
FIG. 10 is a picture of a similar detail of the package of the embodiment of FIG. 4.

FIG. 7-9 are schematic drawings and pictures showing an interface between the stress buffer layer and the second passivation layer with planarization of the first passivation layer of other preferred embodiments of packages according to the present invention; and FIG. 10 is a picture of a similar detail of the package of the embodiment of FIG. 4. The details of a preferred embodiment of the inventive method are also described with the aid of FIG. 7-10, as follows:

A stress buffer layer 74, also called BUMp on Active (BUMA) layer, will be deposited on top of an IC processed wafer 52. The surface of that wafer 52 shall be planarized in a certain degree, to avoid cracks in the passivation layers 56 and 58. The layer stack below the BUMA layer 74 can be planarized in portions of two-layers, i.e., planarisation steps are carried out during manufacture. The BUMA layer 74 is aluminum but may be made in copper, or in an alloy such as aluminum-copper.

The surface roughness mainly is caused by the structure in the last metal layers 54 and 61 and the way of deposition or treatment of the isolation layer 56 of $SiO_2$. When the wafer 52 is not planarized the BUMA layer 74 on top will give the impacts on the bumps 60 during TMCL and drop partly to the surface of the wafer 52, as indicated in FIG. 5 by the arrow. Due to the damping effect of the BUMA layer 74, the impact will not be transferred to the surface of the wafer 52 1 by 1, but still there is enough force to crack the passivation layers 56 of $SiO_2$ and 58 of $Si_3N_4$ underneath the BUMA layer 74. And with such a cracking also the top metallisation will be damaged. FIG. 6. shows a x-section of such a package. It does show a bad surface of the second passivation layer 58 of $Si_3N_4$ to deposit the BUMA layer 74. It will also be difficult to deposit the BUMA layer 74 between the Al piles of the last metal layers of the interconnecting traces 61.

To avoid surface roughness, the $SiO_2$ isolation layer, i.e., the first passivation layer 56, on top of the last metal layers of the I/O pad 54 and of the interconnecting traces 61 can be deposited and treated according to the present invention in different ways, e.g. by deposition of $SiO_2$ using HDP, by deposition of $SiO_2$ using SOG, or by deposition of $SiO_2$ using plasma TEOS and then planarising by CMP.

The first passivation layer 56, i.e., the silicon oxide layer 56, that needs a minimum degree of planarisation will be covered with the second passivation layer 58 of silicon nitride. This layer 58 should preferably be thicker than 400 nm to better avoid pinholes. The nitride layer 58 is very strong and can withstand a lot of force during mechanical loading in board level tests.

A degree of planarisation will be achieved in the case of HDP deposition of the $SiO_2$ layer 56 on top of a plasma oxide (PLOX) layer 55 which is deposited on top of the last metals 54 and 61. A schematic drawing and an x-section can be seen in pictures 7 and 8. Accordingly, FIGS. 7 and 8 show a certain degree of planarisation achieved by HDP. The surface of the second passivation layer 58 is not yet flat, but the impact forces will follow the passivation surface of the second passivation layer 58 in a certain degree. This is indicated by the arrows in FIG. 7. The slope of the passivation surface should preferably be about 45 degrees.

Another way of planarisation is SOG, where the space between the last metal layers 61, in FIG. 9 indicated as INS 61 (INS=second interconnect), is filled up with $SiO_2$ by SOG. FIG. 9 shows an x-section of a planarisation with the help of SOG. According to FIG. 9 in this method of planarisation the last metal layers 61 are first covered with a first PLOX layer 55. This first PLOX layer 55 can have contact to the top surface of the wafer 52 which surface can be $SiO_2$. As can be seen in FIG. 9 the first PLOX layer 55 has nearly the same roughness as the structure created by the last metal layers 61 on the $SiO_2$ surface on the wafer 52. In a second step the gaps between the PLOX-covered last metal layers 61 is filled up with a 56A of $SiO_2$ by SOG. The layer 56A of $SiO_2$ is indicated in FIG. 9 by a darker color. This measure of filling up the gaps makes a relatively smooth overall surface with little roughness. This surface is then covered with a second PLOX layer 57 which is accordingly smooth as can be seen in FIG. 9. The first PLOX layer 55, the $SiO_2$-layer 56A and the second PLOX layer 57 build up a first passivation layer 56. On top of the latter layer 57 of the first passivation layer 56 a second passivation layer 58 of $Si_3N_4$ is then deposited as can be seen in FIG. 9. The second passivation layer 58 provides a nicely smooth fundament for the BUMA layer 74 as can be seen in FIG. 9.

The best way to planarise the wafer surface and in particular the first passivation layer 56 is with CMP, where the $SiO_2$ layer 56 above the last metal layer 61 is completely flattened as can be seen in FIG. 10 which shows an x-section of planarisation of the first passivation layer 56 with CMP. In the case of planarisation with CMP the impact forces induced by drop and TMCL can easily follow the flat surface of the second passivation layer 58.

Although solder balls are used in the illustrated embodiments for electrically connecting the package, it is also possible to use stress buffering elements according to the invention in packages that do not comprise solder balls, for example in more conventional packages comprising wire connections to a leadframe. The advantage of this is that the processes used for providing a stress buffering means can be used for several kinds of packages within a factory.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

Any reference signs in the claims should not be construed as limiting the scope.

The invention claimed is:

1. A semiconductor component comprising:
   a stack of layers, and
   at least one reinforcing structure having at least one integrated anchor-like part in an interconnect structure of metallization layers and dielectric layers, the at least one reinforcing element being configured and arranged to mitigate delamination of the metallization and dielectric layers, wherein the stack of layers includes at least one metal layer and at least one dielectric layer, characterized in that at least one metal layer is connected to at least one dielectric layer by the at least one reinforcing structure.

2. A semiconductor component as claimed in claim 1 wherein said at least one reinforcing element has a T-like shape.

3. A semiconductor component as claimed in claim 1 wherein said at least one reinforcing element having a I-like shape.

4. A semiconductor component as claimed in claim 1 wherein said at least one reinforcing structure includes at least two reinforcing elements interconnected with each other to form at least one of a TT-like reinforcing element, and an II-like reinforcing element.

5. A semiconductor component as claimed in claim 1, wherein at least two layers of the stack of layers are interconnected by the at least one reinforcing structure.

6. A semiconductor component as claimed in claim 1, the stack of layers comprising a first stack of at least one metal layer and at least one normal-k dielectric layer and a second stack of at least one metal layer and at least one low-k dielectric layer,
   wherein at least one reinforcing structure is placed only, in the second stack.

7. A semiconductor component as claimed in claim 1, further including a reinforcing structure including a plurality of reinforcing elements interconnected with each other to form at least one of a U-like reinforcing element, V-like reinforcing element, W-like reinforcing element, M-like reinforcing element, Λ-like reinforcing element, ΛΛ-like reinforcing element, cone-like reinforcing element, frustum-like reinforcing element or triangular-like reinforcing element.

8. A semiconductor component as claimed in claim 1, wherein a length of a part of the reinforcing elements which part is vertical to the plane of the layers of the stack of layers is the same for a majority of the reinforcing elements.

9. A semiconductor component as claimed in claim 1, characterized by a maximum density of reinforcing elements in the stack of layers of 75%.

10. An assembly comprising a board and a semiconductor component as claimed in claim 1, which is electrically connected to the board via a solder ball on an underbump metallization, electrically connected to a stress buffering element.

11. An audio circuit comprising an assembly as claimed in claim 10, wherein said assembly comprises at least one electrical element, the electrical element including a circuit for receiving and amplifying an audio signal.

12. An electronic device, comprising the audio circuit of claim 11.

13. The semiconductor component of claim 1, wherein
the stack of layers includes at least one set of two metallization layers and a dielectric layer between each set of the two metallization layers, and
the at least one reinforcing element is configured and arranged to anchor one of the metallization layers of the set of two metallization layers to the other metallization layer of the set of two metallization layers.

14. A semiconductor component, comprising:
a semiconductor substrate;
an I/O pad, electrically connected to the semiconductor substrate;
a stress buffering element for absorbing stresses, electrically connected to the I/O pad;
a stack of layers, and
at least one reinforcing structure having at least one integrated anchor-like part in an interconnect structure of metallization layers and dielectric layers, the at least one reinforcing element being configured and arranged to mitigate delamination of the metallization and dielectric layers, wherein the reinforcing structure is mainly placed below at least one edge of the stress buffering element.

15. The semiconductor component of claim 14, wherein
the stack of layers includes at least one set of two metallization layers and a dielectric layer between each set of the two metallization layers, and
the at least one reinforcing element is configured and arranged to anchor one of the metallization layers of the set of two metallization layers to the other metallization layer of the set of two metallization layers.

16. A semiconductor component, comprising:
a stack of layers, and
at least one reinforcing structure having at least one integrated anchor-like part in an interconnect structure of metallization layers and dielectric layers, the at least one reinforcing element being configured and arranged to mitigate delamination of the metallization and dielectric layers, wherein at least two of the reinforcing elements of the reinforcing structure are arranged in a staggered layout seen in a direction vertical to the plane of the layers of the stack of layers.

17. A semiconductor component, comprising:
a stack of layers, and
at least one reinforcing structure having at least one integrated anchor-like part in an interconnect structure of metallization layers and dielectric layers, the at least one reinforcing element being configured and arranged to mitigate delamination of the metallization and dielectric layers, wherein the stack of layers includes a density of reinforcing elements which density is increasing from a minimum below a central region of a stress buffering element to a maximum in the out-of-plane direction.

* * * * *